US012563772B2

(12) United States Patent
Shu

(10) Patent No.: US 12,563,772 B2
(45) Date of Patent: Feb. 24, 2026

(54) POWER MOSFET AND MANUFACTURING METHOD THEREOF

(71) Applicant: United Microelectronics Corp., Hsinchu (TW)

(72) Inventor: Yu-Hsiang Shu, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 496 days.

(21) Appl. No.: 18/192,683

(22) Filed: Mar. 30, 2023

(65) Prior Publication Data

US 2024/0322032 A1 Sep. 26, 2024

(30) Foreign Application Priority Data

Mar. 22, 2023 (TW) ................................. 112110780

(51) Int. Cl.
| | |
|---|---|
| *H10D 30/66* | (2025.01) |
| *H10D 30/01* | (2025.01) |
| *H10D 62/17* | (2025.01) |
| *H10D 64/68* | (2025.01) |

(52) U.S. Cl.
CPC ....... *H10D 30/668* (2025.01); *H10D 30/0297* (2025.01); *H10D 62/393* (2025.01); *H10D 64/691* (2025.01)

(58) Field of Classification Search
CPC .. H10D 30/668; H10D 64/691; H10D 62/393; H10D 30/0297
USPC ....................................................... 257/330
See application file for complete search history.

(56) References Cited

U.S. PATENT DOCUMENTS

| | | | |
|---|---|---|---|
| 6,518,129 | B2 | 2/2003 | Hueting et al. |
| 7,847,346 | B2 | 12/2010 | Chung et al. |
| 8,304,825 | B2 | 11/2012 | Garnett |
| 9,716,167 | B2 | 7/2017 | Leng et al. |
| 10,741,687 | B2 | 8/2020 | Leng et al. |
| 2006/0273382 | A1 | 12/2006 | Hshieh |
| 2010/0176448 | A1 | 7/2010 | Hsieh |
| 2011/0006363 | A1 | 1/2011 | Hsieh |
| 2011/0233659 | A1* | 9/2011 | Tai ..................... H10D 30/0297 438/270 |
| 2013/0153999 | A1 | 6/2013 | Zhang et al. |

(Continued)

OTHER PUBLICATIONS

"Office Action of Taiwan Counterpart Application", issued on Dec. 10, 2025, p. 1-p. 3.

*Primary Examiner* — Igwe U Anya
(74) *Attorney, Agent, or Firm* — JCIPRNET

(57) ABSTRACT

Provided are a power MOSFET and a manufacturing method thereof. The power MOSFET includes a substrate, base, doped and drift regions, a gate structure, an insulating layer, a conductive layer, a source electrode and a drain electrode. The base region is in the substrate and adjacent to a first surface of the substrate. The doped region is in the base region and adjacent to the first surface. The drift region is under the base region. The gate structure is in the substrate and includes first and second portions. The first portion is located in the drift region. The second portion is located in the doping, base and drift regions. The insulating layer is disposed between the gate structure and the substrate. The conductive layer surrounds the second portion. The source electrode is connected to the doped region. The drain electrode is disposed on a second surface of the substrate.

21 Claims, 9 Drawing Sheets

(56)            References Cited

U.S. PATENT DOCUMENTS

| | | | |
|---|---|---|---|
| 2021/0020778 A1* | 1/2021 | Su | ........................ H10D 62/107 |
| 2022/0310442 A1 | 9/2022 | Lee et al. | |
| 2023/0020933 A1 | 1/2023 | Wang et al. | |
| 2023/0079309 A1* | 3/2023 | Shirai | ................ H10D 30/0297 |
| | | | 257/288 |

* cited by examiner

POWER MOSFET AND MANUFACTURING METHOD THEREOF

CROSS-REFERENCE TO RELATED APPLICATION

This application claims the priority benefit of Taiwan application serial no. 112110780, filed on Mar. 22, 2023. The entirety of the above-mentioned patent application is hereby incorporated by reference herein and made a part of this specification.

BACKGROUND

Technical Field

The present invention relates to a semiconductor device and a manufacturing method thereof, and in particular to a power metal-oxide-semiconductor field effect transistor (power MOSFET) and a manufacturing method thereof.

Description of Related Art

In the semiconductor technology, a power MOSFETs is used in various electronic apparatuses. By applying an appropriate voltage to the gate of the power MOSFET, the channel between the source and drain may be turned on to allow current to flow from the source to the drain.

Generally speaking, the power MOSFET preferably has a lower on-resistance in the turn-on state. In various vertical power MOSFETs, the source and the drain of the trench-gate power MOSFET (U-MOSFET) are respectively disposed on opposite sides of the substrate, and the gate is disposed in the substrate. In this way, the current path between the source and the drain may be effectively shortened, thereby reducing the on-resistance.

SUMMARY

The present invention provides a power MOSFET and a manufacturing method thereof, wherein a conductive layer surrounds a gate structure located in a base region.

The power MOSFET of the present invention includes a substrate, a base region, a doped region, a drift region, a gate structure, an insulating layer, a conductive layer, a source electrode and a drain electrode. The substrate has a first surface and a second surface opposite to each other. The base region is disposed in the substrate and adjacent to the first surface. The doped region is disposed in the base region, and adjacent to the first surface. The drift region is disposed in the substrate and located below the base region. The gate structure is disposed in the substrate and includes a first portion and a second portion, wherein the first portion is located in the drift region, and the second portion is located in the doped region, the base region and the drift region. The insulating layer is disposed between the gate structure and the substrate. The conductive layer surrounds the second portion and is located between the insulating layer and the substrate. The source electrode is disposed on the first surface and connected to the doped region. The drain electrode is disposed on the second surface. The substrate, the doped region and the drift region have a first conductive type, and the base region has a second conductive type.

In an embodiment of the power MOSFET of the present invention, a material of the conductive layer includes metal or conductive compound.

In an embodiment of the power MOSFET of the present invention, the metal includes gold or titanium.

In an embodiment of the power MOSFET of the present invention, the conductive compound includes metal silicide, metal oxide or conductive polymer.

In an embodiment of the power MOSFET of the present invention, the conductive layer is located on a sidewall and a bottom of the first portion.

In an embodiment of the power MOSFET of the present invention, the first portion and the second portion are connected to each other.

In an embodiment of the power MOSFET of the present invention, the insulating layer is further located between the first portion and the second portion and between the conductive layer and the second portion.

In an embodiment of the power MOSFET of the present invention, a width of the second portion is larger than a width of the first portion.

In an embodiment of the power MOSFET of the present invention, a bottom surface of the base region is not lower than a bottom surface of the second portion.

In an embodiment of the power MOSFET of the present invention, a concentration of dopant in the doped region is between $1 \times 10^{17}$ cm$^{-3}$ and $1 \times 10^{21}$ cm$^{-3}$.

In an embodiment of the power MOSFET of the present invention, a concentration of dopant in the base region is between $1 \times 10^{14}$ cm$^{-3}$ and $1 \times 10^{18}$ cm$^{-3}$.

In an embodiment of the power MOSFET of the present invention, a concentration of dopant in the drift region is between $1 \times 10^{16}$ cm$^{-3}$ and $1 \times 10^{18}$ cm$^{-3}$.

In an embodiment of the power MOSFET of the present invention, a concentration of dopant in the substrate is between $1 \times 10^{14}$ cm$^{-3}$ and $1 \times 10^{21}$ cm$^{-3}$.

In an embodiment of the power MOSFET of the present invention, a material of the gate structure includes polysilicon.

The manufacturing method of a power MOSFET of the present invention includes the following steps. A substrate having a first surface and a second surface opposite each other is provided. A doped region, a base region and a drift region are formed in the substrate, wherein the base region is adjacent to the first surface, the doped region is located in the base region and adjacent to the first surface, and the drift region is located below the base region. A gate structure is formed in the substrate, wherein the gate structure comprises a first portion and a second portion, the first portion is located in the drift region, and the second portion is located in the doped region, the base region and the drift region. An insulating layer is formed between the gate structure and the substrate. A conductive layer is formed to surround the second portion, wherein the conductive layer is located between the insulating layer and the substrate. A source electrode is formed on the first surface, wherein the source electrode is connected to the doped region. A drain electrode is formed on the second surface. The substrate, the doped region and the drift region have a first conductive type, and the base region has a second conductive type.

In an embodiment of the manufacturing method of a power MOSFET of the present invention, the forming method of the gate structure, the insulating layer and the conductive layer includes the following steps. A first trench is formed in the substrate. A conductive material layer is formed on a sidewall and a bottom of the first trench. A first insulating material layer is formed on the conductive material layer. A first gate material layer is formed to fill up the first trench. The conductive material layer, the first insulating material layer and the first gate material layer in an upper portion of the first trench and a part of the substrate around the upper portion of the first trench are removed to form a second trench. A second insulating material layer is formed on a sidewall and a bottom of the second trench. A second gate material layer is formed to fill up the second trench.

In an embodiment of the manufacturing method of a power MOSFET of the present invention, the conductive material layer located on the bottom of the first trench is further removed after forming the conductive material layer and before forming the first insulating material layer.

In an embodiment of the manufacturing method of a power MOSFET of the present invention, a forming method of the conductive layer material layer includes a chemical vapor deposition process or a sputtering process.

In an embodiment of the manufacturing method of a power MOSFET of the present invention, a material of the conductive layer includes metal or conductive compound.

In an embodiment of the manufacturing method of a power MOSFET of the present invention, the metal includes gold or titanium.

In an embodiment of the manufacturing method of a power MOSFET of the present invention, the conductive compound includes metal silicide, metal oxide or conductive polymer.

Based on the above, in the present invention, the first portion of the gate structure is located in the drift region, the second portion of the gate structure is located in the doped region, the base region and the drift region, and the conductive layer surrounds the first portion of the gate structure. The on-resistance of the power MOSFET may be effectively reduced by the conductive layer, so that the power MOSFET may have higher performance.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
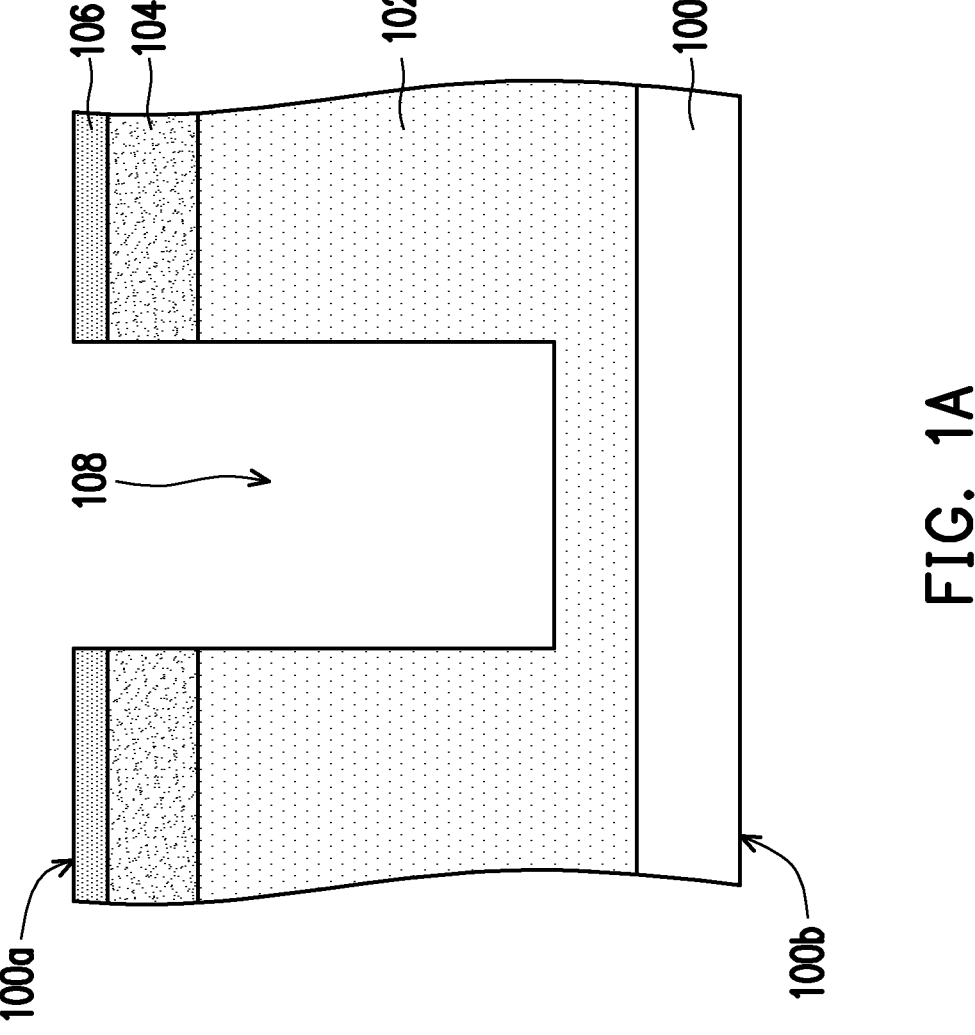
FIGS. 1A to 1G are schematic cross-sectional views of the manufacturing process of the power MOSFET of the first embodiment of the present invention.

The embodiments are described in detail below with reference to the accompanying drawings, but the embodiments are not intended to limit the scope of the present invention. In addition, the drawings are for illustrative purposes only and are not drawn to the original dimensions. For the sake of easy understanding, the same elements in the following description will be denoted by the same reference numerals.

In the text, the terms mentioned in the text, such as "comprising", "including", "containing" and "having" are all open-ended terms, i.e., meaning "including but not limited to".

When using terms such as "first" and "second" to describe elements, it is only used to distinguish the elements from each other, and does not limit the order or importance of the devices. Therefore, in some cases, the first element may also be called the second element, the second element may also be called the first element, and this is not beyond the scope of the present invention.

In addition, the directional terms, such as "on", "above", "under" and "below" mentioned in the text are only used to refer to the direction of the drawings, and are not used to limit the present invention.

Also, herein, a range expressed by "one value to another value" is a general representation to avoid enumerating all values in the range in the specification. Thus, the recitation of a particular numerical range encompasses any numerical value within that numerical range, as well as smaller numerical ranges bounded by any numerical value within that numerical range.

FIGS. 1A to 1G are schematic cross-sectional views of the manufacturing process of the power MOSFET of the first embodiment of the present invention.

Referring to FIG. 1A, a substrate 100 is provided. In the present embodiment, the substrate 100 is a silicon substrate. The substrate 100 has a first surface 100a and a second surface 100b opposite to each other. Next, a drift region 102, a base region 104 and a doped region 106 are formed in the substrate 100. The forming method of the drift region 102, the base region 104 and the doped region 106 is, for example, performing an ion implantation process. In the present embodiment, the substrate 100, the drift region 102 and doped region 106 have the same conductive type, while the base region 104 has the opposite conductive type. For example, the substrate 100, the drift region 102 and the doped region 106 may be p-type, and the base region 104 may be n-type, but the present invention is not limited thereto. The base region 104 is formed in the substrate 100 and adjacent to the first surface 100a. The drift region 102 is formed below the base region 104. The doped region 106 is formed in the base region 104 and adjacent to the first surface 100a. The detailed formation methods of the drift region 102, the base region 104 and the doped region 106 are well known to those skilled in the art, and will not be further described here.

In the present embodiment, the concentration of the dopant in the substrate 100 may be between $1 \times 10^{14}$ cm$^{-3}$ and $1 \times 10^{21}$ cm$^{-3}$, and the concentration of the dopant in the drift region 102 may be between $1 \times 10^{16}$ cm$^{-3}$ and $1 \times 10^{18}$ cm$^{-3}$, the concentration of the dopant in the base region 104 may be between $1 \times 10^{14}$ cm$^{-3}$ and $1 \times 10^{18}$ cm$^{-3}$, and the concentration of the dopant in the doped region 106 may be between $1 \times 10^{17}$ cm$^{-3}$ and $1 \times 10^{21}$ cm$^{-3}$. The base region 104 may be used as the channel region of the power MOSFET of the present embodiment, and the doped region 106 may be used as the source terminal of the power MOSFET of the present embodiment.

Next, a first trench 108 is formed in the substrate 100. In detail, in the present embodiment, an anisotropic etching process may be performed to remove a part of the substrate 100 so that the bottom of the first trench 108 is located in the drift region 102. In the present embodiment, the first trench 108 is used as a region for forming the gate structure of the power MOSFET of the present embodiment.

Figure 1B:
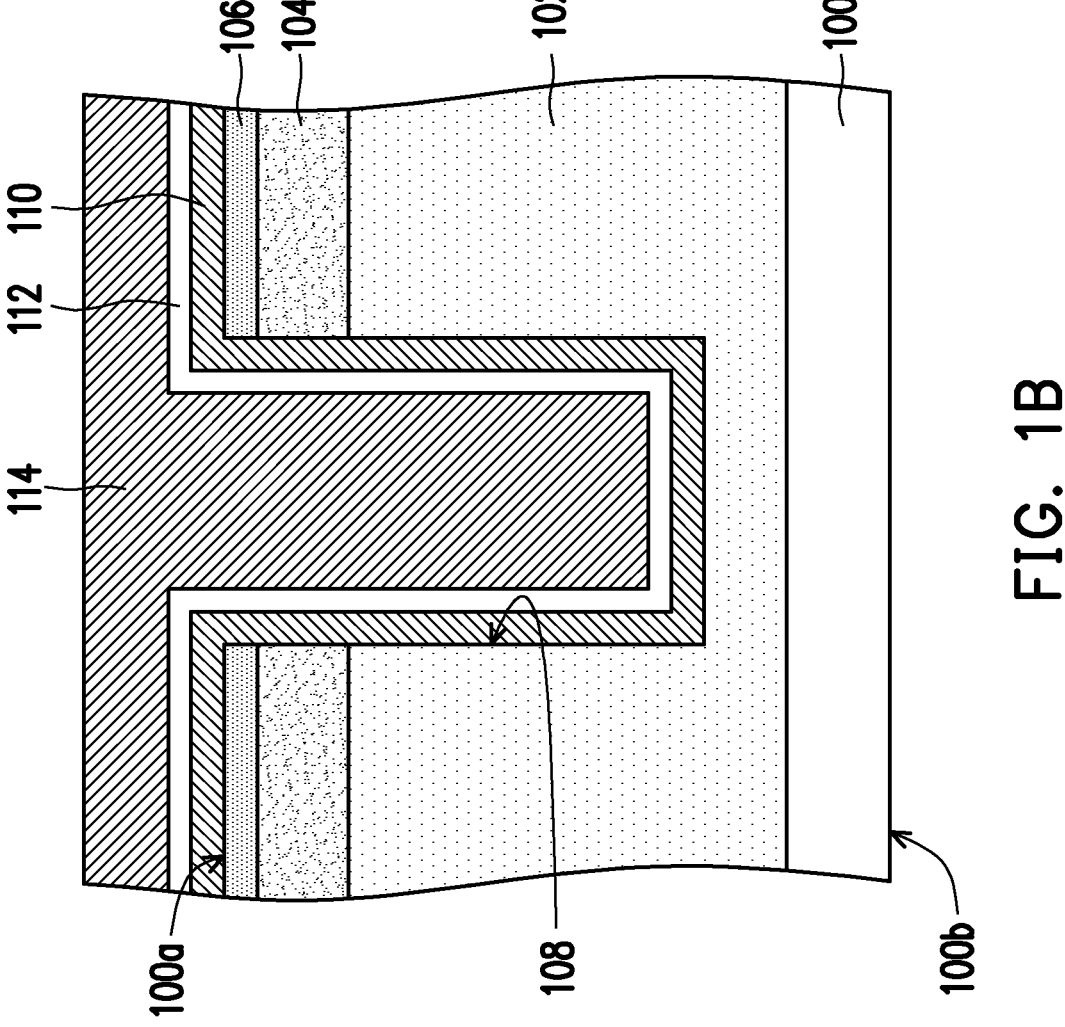

Referring to FIG. 1B, a conductive material layer 110 is formed on the sidewall and the bottom of the first trench 108. The material of the conductive layer material layer 110 is, for example, metal or conductive compound. The metal may be gold or titanium, and the conductive compound may be metal silicide, metal oxide or conductive polymer. In the present embodiment, the material of the conductive layer material layer 110 is preferably gold, and the conductive layer formed therefrom may have higher stability in subsequent manufacturing processes, but the present invention is not limited thereto. The forming method of the conductive layer material layer 110 is, for example, performing a chemical vapor deposition (CVD) process or a sputtering process to conformally form the conductive layer material layer 110 on the substrate 100. Next, a first insulating material layer 112 is formed on the conductive material layer 110. The material of the first insulating material layer 112 is oxide, for example. The first insulating material layer 112 is used to separate the gate structure of the power MOSFET formed later from the conductive layer formed by the conductive layer material layer 110. The forming method of the first insulating material layer 112 is, for example, performing a chemical vapor deposition process to conformally form the first insulating material layer 112 on the conductive layer material layer 110. Afterwards, a first gate material layer 114 is formed on the first insulating material layer 112, and the first gate material layer 114 fills up the first trench 108. The material of the first gate material layer 114 is, for example, polysilicon. The first gate material layer 114 is used to form the gate structure of the power MOSFET. The forming method of the first gate material layer 114 is, for example, performing a chemical vapor deposition process.

Figure 1C:
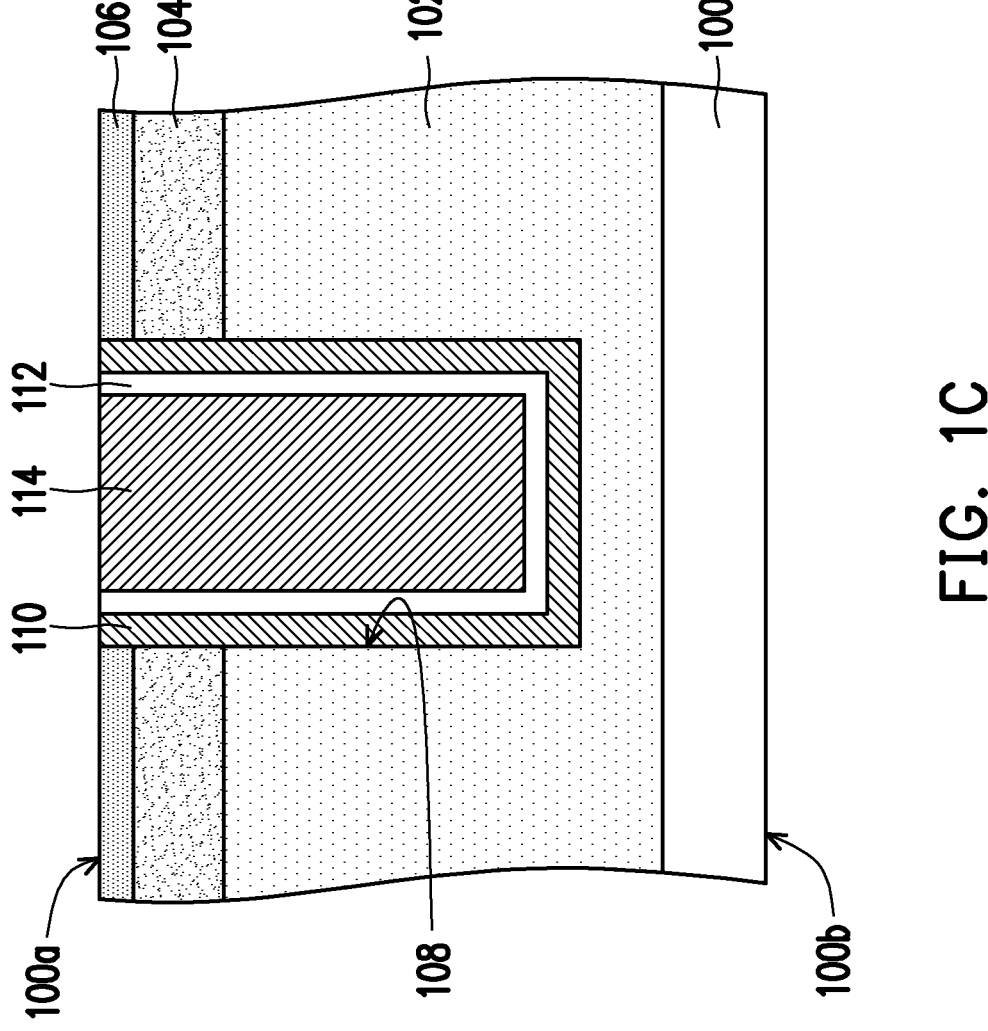

Referring to FIG. 1C, the conductive material layer 110, the first insulating material layer 112 and the first gate material layer 114 outside the first trench 108 are removed. In the present embodiment, the removing method of the conductive material layer 110, the first insulating material layer 112 and the first gate material layer 114 outside the first trench 108 is, for example, performing a chemical mechanical polishing (CMP) process.

Figure 1D:
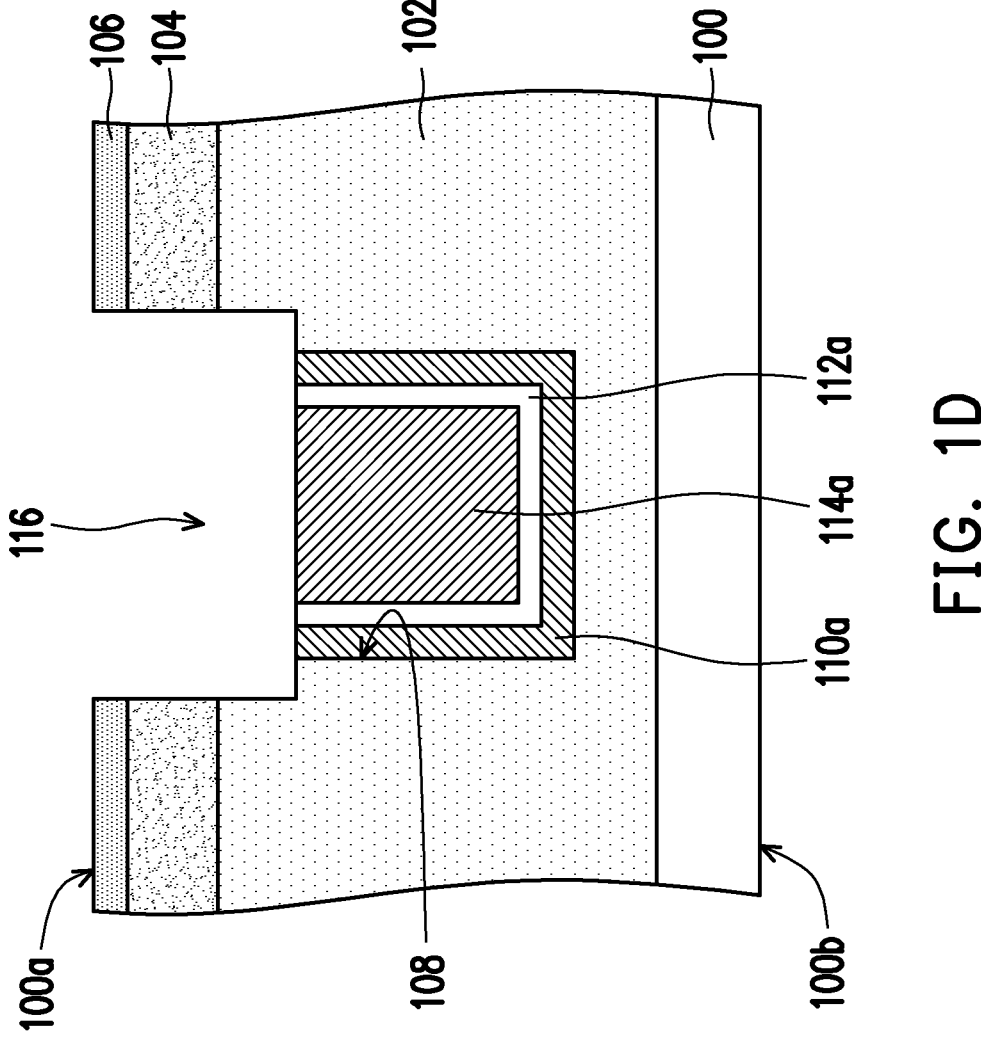

Referring to FIG. 1D, the conductive material layer 110, the first insulating material layer 112 and the first gate material layer 114 in the upper portion of the first trench 108 and a part of the substrate 100 around the upper portion of the first trench 108 are removed to form a second trench 116. In detail, in the present embodiment, an anisotropic etching process may be performed to remove the conductive material layer 110, the first insulating material layer 112 and the first gate material layer 114 in the upper portion of the first trench 108 and the part of the substrate 100 around the upper portion of the first trench 108 such that the bottom of the formed second trench 116 is located in the drift region 102. In this way, the second trench 116 may be formed above the first trench 108, and the first trench 108 and the second trench 116 may be jointly used as a region for forming the gate structure of the power MOSFET of the present embodiment.

In addition, in the present embodiment, the width of the second trench 116 is larger than the width of the first trench 108, but the present invention is not limited thereto. In other embodiments, depending on actual needs, the second trench 116 and the first trench 108 may have the same width.

After the second trench 116 is formed, a conductive layer 110a, an insulating layer 112a and a first portion 114a of the gate structure of the power MOSFET of the present embodiment are formed in the first trench 108. That is, in the present embodiment, the entire first portion 114a of the gate structure is located in the drift region 102 and surrounded by the conductive layer 110a.

Figure 1E:
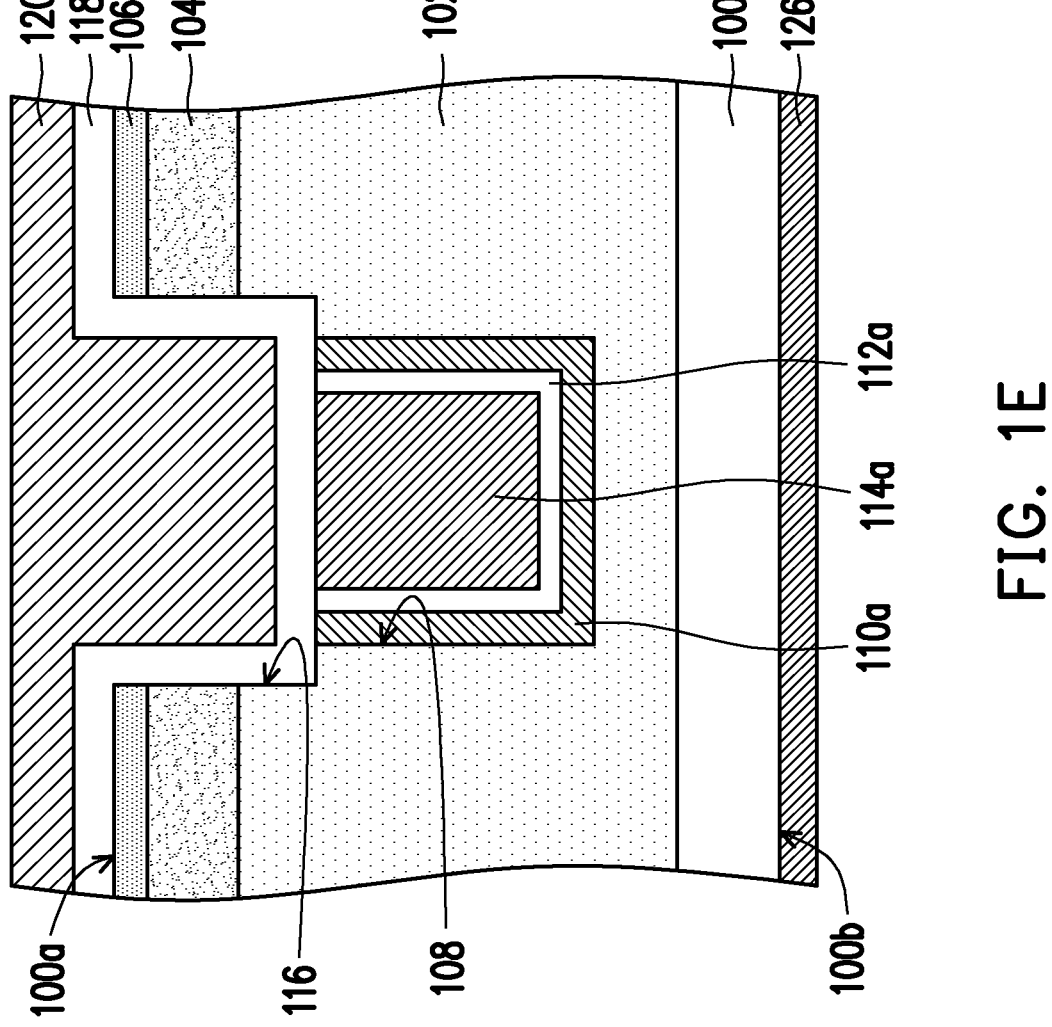

Referring to FIG. 1E, a second insulating material layer 118 is formed on the sidewall and the bottom of the second trench 116. The material of the second insulating material layer 112 is oxide, for example. The second insulating material layer 118 is used to separate the gate structure of the power MOSFET formed later from the substrate 100. The forming method of the second insulating material layer 118 is for example, performing a chemical vapor deposition process to conformally form the second insulating material layer 118 on the substrate 100. Afterwards, a second gate material layer 120 is formed on the second insulating material layer 118, and the second gate material layer 120 fills up the second trench 116. The material of the second gate material layer 120 is polysilicon, for example. The second gate material layer 120 is used to form the gate structure of the power MOSFET. The forming method of the second gate material layer 120 is, for example, performing a chemical vapor deposition process.

Figure 1F:
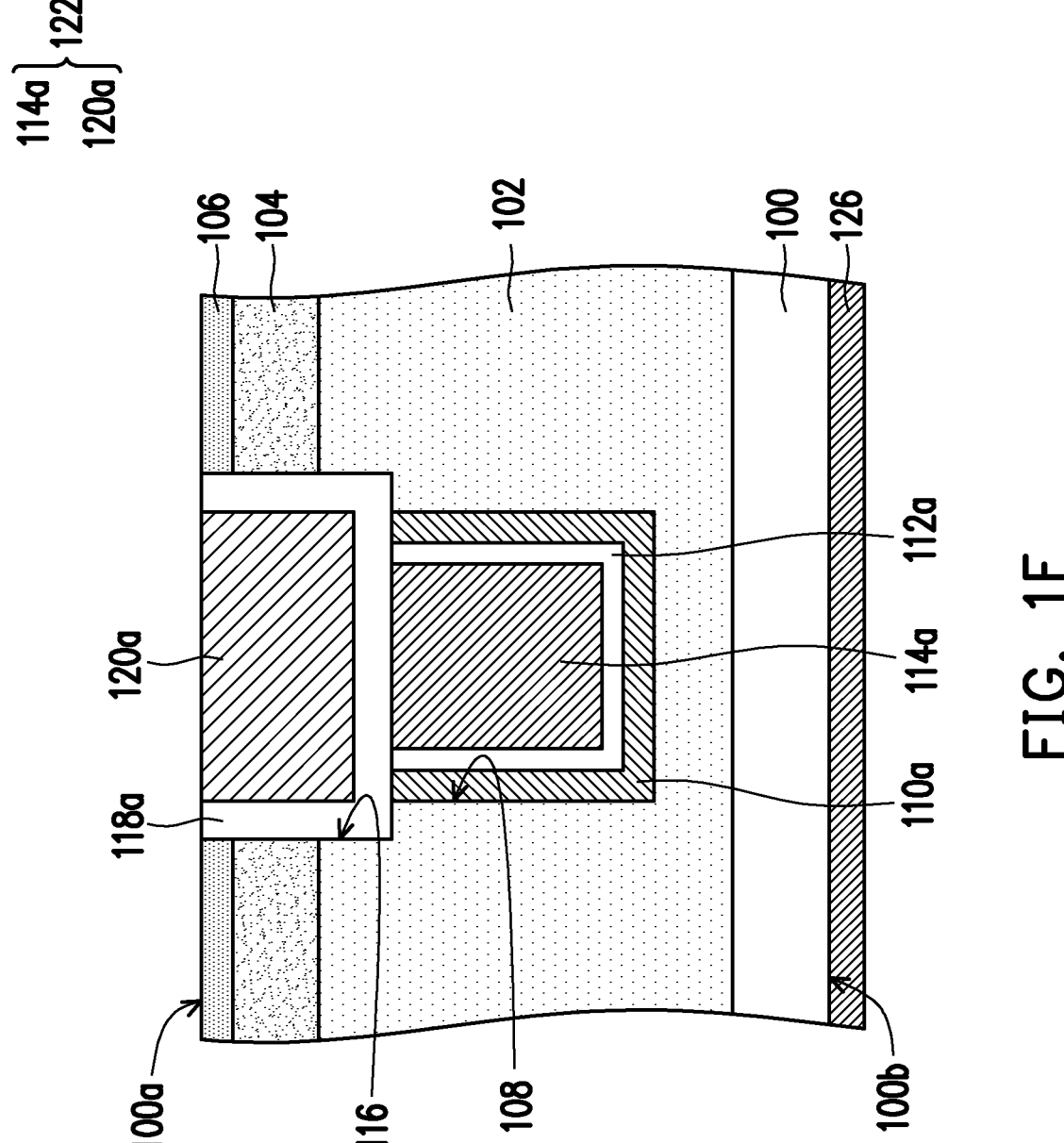

Referring to FIG. 1F, the second insulating material layer 118 and the second gate material layer 120 outside the second trench 116 are removed to form a insulating layer 118a and a second portion 120a of the gate structure of the power MOSFET of the present embodiment in the second trench 116. That is, in the present embodiment, the second portion 120a of the gate structure is located in the doped region 106, the base region 104 and the drift region 102, and the second portion 120a and the first portion 114a are separated from each other by the insulating layer 118a. In addition, the first portion 114a and the second portion 120a form the gate structure 122. In the present embodiment, the removing method of the second insulating material layer 118 and the second gate material layer 120 outside the second trench 116 is, for example, performing a chemical mechanical polishing process.

Figure 1G:
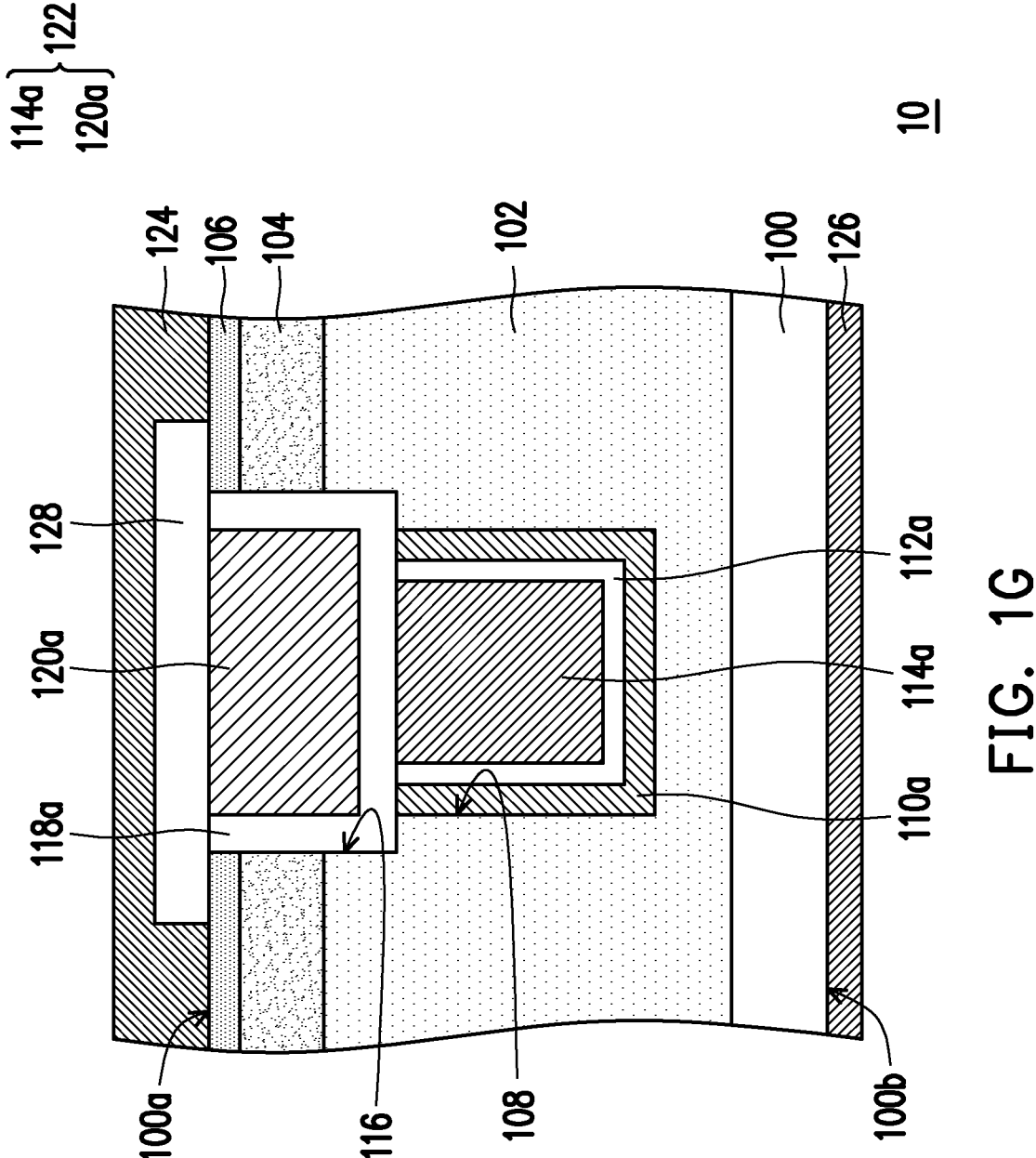

Referring to FIG. 1G, a source electrode 124 connected to the doped region 106 is formed on the first surface 100a of the substrate 100 and a drain electrode 126 is formed on the second surface 100b of the substrate 100. In addition, in order to avoid short circuit caused by contact between the source electrode 124 and the second portion 120a of the gate structure 122, an isolation layer 128 may be formed between the source electrode 124 and the second portion 120a of the gate structure 122. In the present embodiment, the isolation layer 128 may be an oxide layer, a nitride layer or a combination thereof. In the present embodiment, the isolation layer 128 covers the top surface of the second portion 120a of the gate structure 122, and the source electrode 124 covers the isolation layer 128, but the present invention is not limited thereto. The detailed forming methods of the source electrode 124, the drain electrode 126 and the isolation layer 128 are well known to those skilled in the art, and will not be further described here. In this way, the power MOSFET 10 of the present embodiment is formed.

In the power MOSFET 10 of the present embodiment, the base region 104 is disposed in the substrate 100 and adjacent to the first surface 100a, the drift region 102 is disposed below the base region 104, and the doped region 106 is disposed in the base region 104 and adjacent to the first surface 100a. In addition, the entire first portion 114a of the gate structure 122 is located in the drift region 102, and the second portion 120a of the gate structure 122 is located in the doped region 106, the base region 104 and the drift region 102. The insulating layer 112a is disposed between the first portion 114a of the gate structure 122 and the substrate 100, and the insulating layer 118a is disposed between the second portion 120a of the gate structure 122 and the substrate 100 and between the second portion 120a and the first portion 114a. In addition, the conductive layer 110a surrounds the first portion 114a of the gate structure. In the present embodiment, the conductive layer 110a is located on the sidewall and the bottom of the first portion 114a.

In the present embodiment, the gate structure 122 is disposed in the substrate 100, so the gate structure 122 is a trench gate structure, which may effectively shorten the current path between the source and the drain to reduce the on-resistance.

In addition, in the present embodiment, the second portion 120a of the gate structure 122 is located in the doped region 106, the base region 104 and the drift region 102, so the bottom of the base region 104 is not lower than the bottom of the second portion 120a. In this way, the influence of the electric field generated when the voltage is applied to the first portion 114a of the gate structure 122 on the channel region (the region adjacent to the second portion 120a in the base region 104) may be avoided. On the other hand, a voltage higher than that applied to the second portion 120a of the gate structure 122 may be applied to the first portion 114a of the gate structure 122 to further improve the performance of the power MOSFET 10.

In addition, in the present embodiment, the conductive layer 110a surrounds the first portion 114a of the gate structure 122 and is located between the insulating layer 112a and the substrate 100. Since the conductive layer 110a has a lower resistance value than the base region 102, the on-resistance of the power MOSFET is reduced, so that when the current flows from the source terminal to the drain terminal, the accumulation of electrons toward the region adjacent to the conductive layer 110a may be promoted. As a result, the power MOSFET 10 may have higher efficiency.

In the first embodiment, the conductive layer 110a surrounds the first portion 114a of the gate structure 122, and the conductive layer 110a is located on the sidewall and the bottom of the first portion 114a, but the present invention is not limited thereto.

Figure 2:
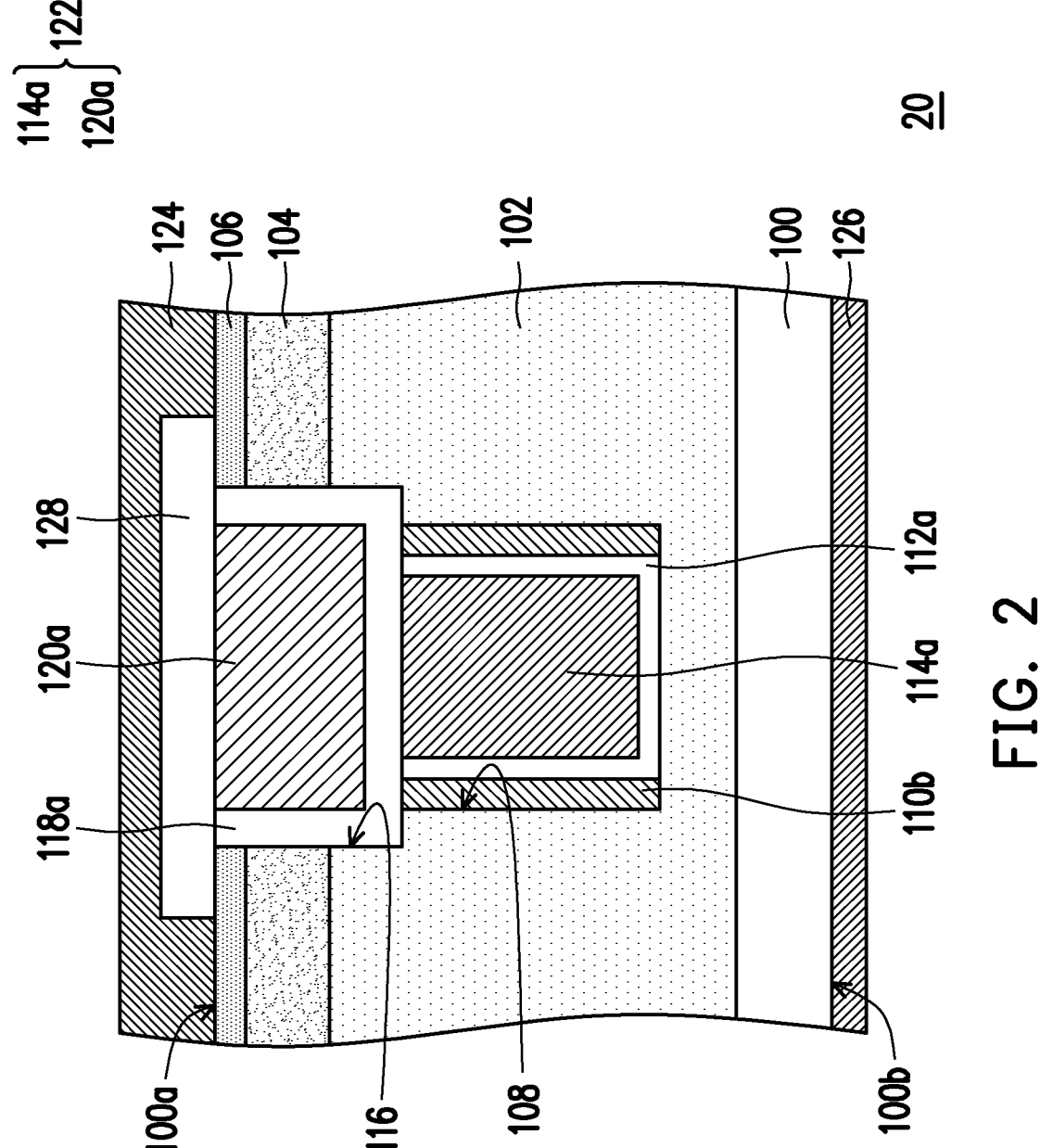
FIG. 2 is a schematic cross-sectional view of the power MOSFET of the second embodiment of the present invention.

FIG. 2 is a schematic cross-sectional view of the power MOSFET of the second embodiment of the present invention. In the present embodiment, the same device as that of the first embodiment will be denoted by the same reference symbols and will not be described again.

Referring to FIG. 2, in the power MOSFET 20 of the present embodiment, the conductive layer 110b surrounds the first portion 114a of the gate structure, and the conductive layer 110b is located on the sidewall of the first portion 114a, but not located on the bottom of the first portion 114a. That is, in FIG. 1B, after the conductive material layer 110 is formed on the sidewall and the bottom of the first trench 108, an anisotropic etching process may be performed to remove the conductive material layer 110 on the bottom of the first trench 108, and then the first insulating material layer 112 is formed.

In addition, in each of the above embodiments, the first portion 114a and the second portion 120a of the gate structure 122 are separated from each other by the insulating layer 118a, but the present invention is not limited thereto. In other embodiments, the first portion 114a and the second portion 120a of the gate structure 122 may be connected to each other.

Figure 3:
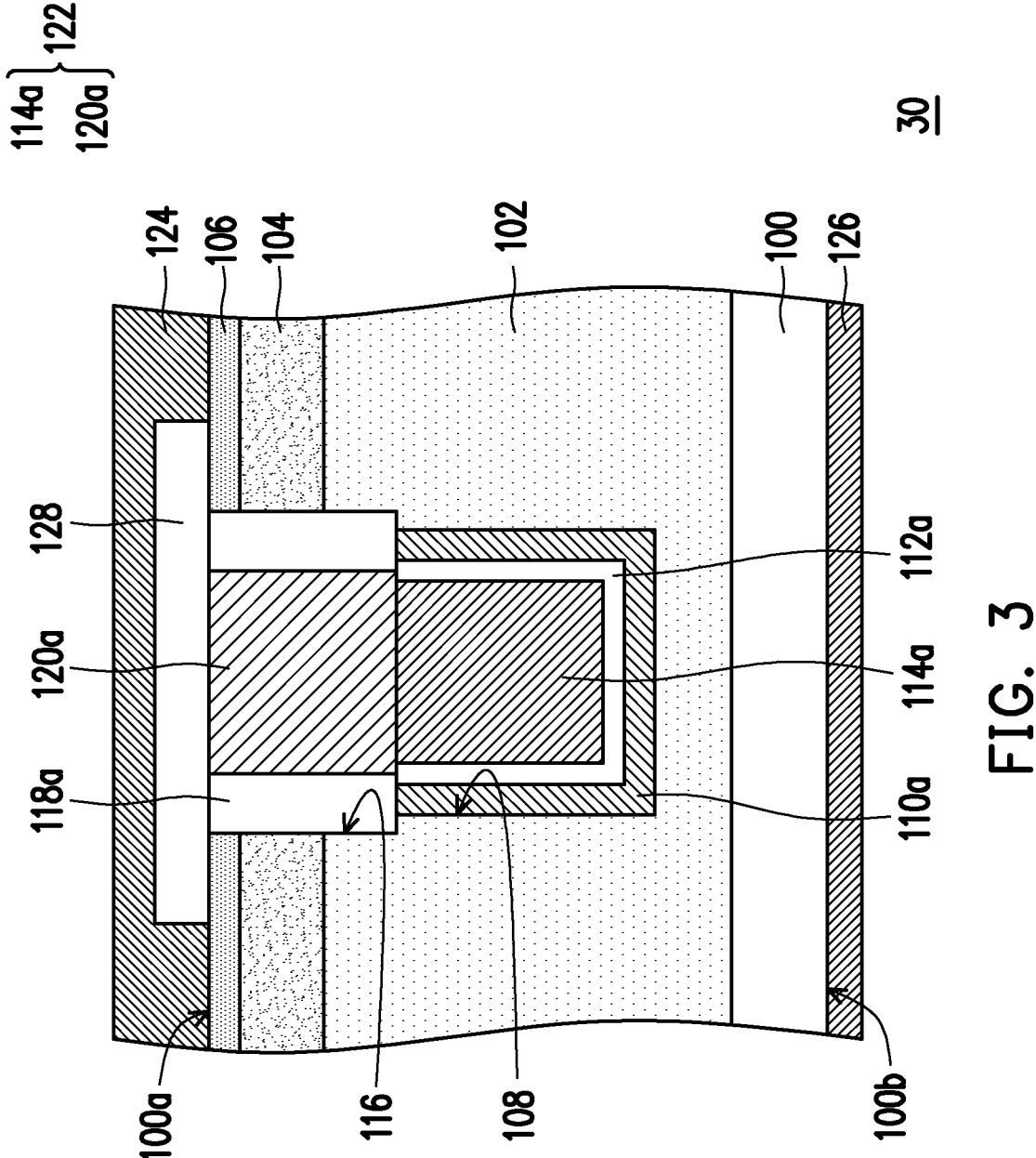
FIG. 3 is a schematic cross-sectional view of the power MOSFET of the third embodiment of the present invention.

FIG. 3 is a schematic cross-sectional view of the power MOSFET of the third embodiment of the present invention. In the present embodiment, the same device as that of the first embodiment will be denoted by the same reference symbols and will not be described again.

Referring to FIG. 3, in the power MOSFET 30 of the present embodiment, the first portion 114a and the second portion 120a of the gate structure 122 are connected to each other, and the edge of the second portion 120a is located above the top surface of the insulating layer 112a. That is, in FIG. 1E, after the second insulating material layer 118 is formed on the sidewall and the bottom of the second trench 116, an anisotropic etching process may be performed to remove the second insulating material layer 118 on the bottom of the second trench 116, and then the second gate material layer 120 is formed. In addition, by controlling the thickness of the formed second insulating material layer 118, the edge of the second portion 120a of the gate structure 122 may be located above the top surface of the insulating layer 112a. In this way, the second portion 120a of the gate structure 122 may be prevented from contacting the conductive layer 110a to cause a short circuit.

In addition, in other embodiments, the second portion 120a may be formed only on the top surface of the first portion 114a according to actual needs.

It will be apparent to those skilled in the art that various modifications and variations may be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A power metal-oxide-semiconductor field effect transistor, comprising:
   a substrate, having a first surface and a second surface opposite to each other;
   a base region, disposed in the substrate and adjacent to the first surface;
   a doped region, disposed in the base region, and adjacent to the first surface;
   a drift region, disposed in the substrate and located below the base region;
   a gate structure, disposed in the substrate and comprising a first portion and a second portion, wherein the first portion is located in the drift region, and the second portion is located in the doped region, the base region and the drift region;
   an insulating layer, disposed between the gate structure and the substrate;
   a conductive layer, surrounding the second portion and located between the insulating layer and the substrate;
   a source electrode, disposed on the first surface and connected to the doped region; and
   a drain electrode, disposed on the second surface,
   wherein the substrate, the doped region and the drift region have a first conductive type, and the base region has a second conductive type.

2. The power metal-oxide-semiconductor field effect transistor of claim 1, wherein a material of the conductive layer comprises metal or conductive compound.

3. The power metal-oxide-semiconductor field effect transistor of claim 2, wherein the metal comprises gold or titanium.

4. The power metal-oxide-semiconductor field effect transistor of claim 2, wherein the conductive compound comprises metal silicide, metal oxide or conductive polymer.

5. The power metal-oxide-semiconductor field effect transistor of claim 1, wherein the conductive layer is located on a sidewall and a bottom of the first portion.

6. The power metal-oxide-semiconductor field effect transistor of claim 1, wherein the first portion and the second portion are connected to each other.

7. The power metal-oxide-semiconductor field effect transistor of claim 1, wherein the insulating layer is further located between the first portion and the second portion and between the conductive layer and the second portion.

8. The power metal-oxide-semiconductor field effect transistor of claim 1, wherein a width of the second portion is larger than a width of the first portion.

9. The power metal-oxide-semiconductor field effect transistor of claim 1, wherein a bottom surface of the base region is not lower than a bottom surface of the second portion.

10. The power metal-oxide-semiconductor field effect transistor of claim 1, wherein a concentration of dopant in the doped region is between $1\times10^{17}$ cm$^{-3}$ and $1\times10^{21}$ cm$^{-3}$.

11. The power metal-oxide-semiconductor field effect transistor of claim 1, wherein a concentration of dopant in the base region is between $1\times10^{14}$ cm$^{-3}$ and $1\times10^{18}$ cm$^{-3}$.

12. The power metal-oxide-semiconductor field effect transistor of claim 1, wherein a concentration of dopant in the drift region is between $1\times10^{16}$ cm$^{-3}$ and $1\times10^{18}$ cm$^{-3}$.

13. The power metal-oxide-semiconductor field effect transistor of claim 1, wherein a concentration of dopant in the substrate is between $1\times10^{14}$ cm$^{-3}$ and $1\times10^{21}$ cm$^{-3}$.

14. The power metal-oxide-semiconductor field effect transistor of claim 1, wherein a material of the gate structure comprises polysilicon.

15. A manufacturing method of a power metal-oxide-semiconductor field effect transistor, comprising:

providing a substrate having a first surface and a second surface opposite each other;

forming a doped region, a base region and a drift region in the substrate, wherein the base region is adjacent to the first surface, the doped region is located in the base region and adjacent to the first surface, and the drift region is located below the base region;

forming a gate structure in the substrate, wherein the gate structure comprises a first portion and a second portion, the first portion is located in the drift region, and the second portion is located in the doped region, the base region and the drift region;

forming an insulating layer between the gate structure and the substrate;

forming a conductive layer to surround the second portion, wherein the conductive layer is located between the insulating layer and the substrate;

forming a source electrode on the first surface, wherein the source electrode is connected to the doped region; and forming a drain electrode on the second surface, wherein the substrate, the doped region and the drift region have a first conductive type, and the base region has a second conductive type.

16. The manufacturing method of claim 15, wherein a forming method of the gate structure, the insulating layer and the conductive layer comprises:

forming a first trench in the substrate;

forming a conductive material layer on a sidewall and a bottom of the first trench;

forming a first insulating material layer on the conductive material layer;

forming a first gate material layer to fill up the first trench;

removing the conductive material layer, the first insulating material layer and the first gate material layer in an upper portion of the first trench and a part of the substrate around the upper portion of the first trench to form a second trench;

forming a second insulating material layer on a sidewall and a bottom of the second trench; and forming a second gate material layer to fill up the second trench.

17. The manufacturing method of claim 16, further comprising removing the conductive material layer located on the bottom of the first trench after forming the conductive material layer and before forming the first insulating material layer.

18. The manufacturing method of claim 16, wherein a forming method of the conductive layer material layer comprises a chemical vapor deposition process or a sputtering process.

19. The manufacturing method of claim 15, wherein a material of the conductive layer comprises metal or conductive compound.

20. The manufacturing method of claim 19, wherein the metal comprises gold or titanium.

21. The manufacturing method of claim 19, wherein the conductive compound comprises metal silicide, metal oxide or conductive polymer.

\* \* \* \* \*